US008557612B2

(12) United States Patent
Henry et al.

(10) Patent No.: US 8,557,612 B2
(45) Date of Patent: Oct. 15, 2013

(54) METHOD FOR FABRICATING MICRO AND NANOSTRUCTURES IN A MATERIAL

(75) Inventors: Michael David Henry, Altadena, CA (US); Michael Shearn, San Antonio, TX (US); Axel Scherer, Laguna Beach, CA (US)

(73) Assignee: California Institute of Technology, Pasadena, CA (US)

( * ) Notice: Subject to any disclaimer, the term of this patent is extended or adjusted under 35 U.S.C. 154(b) by 419 days.

(21) Appl. No.: 12/824,128

(22) Filed: Jun. 25, 2010

(65) Prior Publication Data

US 2011/0020960 A1    Jan. 27, 2011

Related U.S. Application Data

(60) Provisional application No. 61/220,982, filed on Jun. 26, 2009.

(51) Int. Cl.
*H01L 21/00* (2006.01)

(52) U.S. Cl.
USPC .......... 438/8; 438/9; 438/634; 438/705; 438/706; 438/733; 438/735; 438/738; 438/740; 438/911; 438/924; 257/E21.218; 257/E21.219; 257/E21.246; 257/E21.529; 216/62; 216/87

(58) Field of Classification Search
None
See application file for complete search history.

(56) References Cited

U.S. PATENT DOCUMENTS

2010/0065941 A1*   3/2010   Wells et al. .................. 257/510

OTHER PUBLICATIONS

Barrett, C.S., et al., Lattice Constants of Gallium at 297 K, Nature 1965, 207: 1382.
Chekurov, N., et al., The Fabrication of Silicon Nanostructures by Local Gallium Implantation and Cryogenic Deep Reactive Ion Etching, Nanotechnology 2009, 20: 065307-1-065307-5.
deBoer, M., et al., Guidelines for Etching Silicon MEMS Structures Using Fluorine High-Density Plasmas at Cryogenic Temperatures, Journal of Microelectrochemical Systems 2002, 11: 385-401.
Frey, L., et al., Nanoscale Effects in Focused Ion Beam Processing, Applied Physics A: Materials Science & Processing 2003, 76: 1017-1023.
Gates, B., et al., New Approaches to Nanofabrication: Molding, Printing, and Other Techniques, Chemical Reviews 2005, 105: 1171-1196.
Gierak, J., et al., Exploration of the Ultimate Patterning Potential Achievable with High Resolution Focused Ion Beams, Applied Physics A: Materials Science & Processing 2005, 80: 187-194.
Henry, M.D., et al., Alumina Etch Masks for Fabrication of High-Aspect-Ratio Silicon Micropillars and Nanopillars, Nanotechnology 2009, 20: 255305-1-255305-4.
Jansen, H.V., et al., Black Silicon Method X: A Review on High Speed and Selective Plsma Etching of Silicon with Profile Control: An In-Depth Comparison Between Bosch and Cryostat DRIE Processes as a Roadmap to Next Generation Equipment, Journal of Micromechanics and Microengineering 2009, 19: 033001-1-033001-41.

(Continued)

*Primary Examiner* — Julio J Maldonado
*Assistant Examiner* — Yasser Abdelaziez
(74) *Attorney, Agent, or Firm* — Steinfl & Bruno, LLP

(57) ABSTRACT

A method to determine minimum etch mask dosage or thickness as a function of etch depth or maximum etch depth as a function of etch mask implantation dosage or thickness, for fabricating structures in or on a substrate through etch masking via addition or removal of a masking material and subsequent etching.

23 Claims, 6 Drawing Sheets

(56) References Cited

OTHER PUBLICATIONS

Kato, N.I., et al., Side-wall Damage in a Transmission Electron Microscopy Specimen of Crystalline Si Prepared by Focused Ion Beam Etching, Journal of Vacuum Science Technology A 1999, 17: 1201-1024.
Marrian, C., et al., Nanofabrication, Journal of Vacuum Science Technology A 2003, 21: S207-S215.
Melngailis, J., et al., A Review of Ion Projection Lithography, Journal of Vacuum Science Technology B 1998, 16: 927-957.
Mosher, L., et al., Double-Exposure Grayscale Photolithography, Journal of Microelectromechanical Systems 2009, 18: 308-315.
Qian, H.X., et al., Fabrication of Si Microstructures Using Focused Ion Beam Implantation and Reactive Ion Etching, Journal of Micromechanics and Microengineering 2008, 18: 035003-1-035003-5.
Schmidt, B., et al., Writing FIB Implantation and Subsequent Anisotropic Wet Chemical Etching for Fabrication of 3D Structures in Silicon, Sensors and Actuatuors A: Physical 1997, 61: 369-373.
Schmidt, B., et al., Etch Rate Retardation of $Ga^+$-Ion Beam-Irradiated Silicon, Journal of The Electrochemical Society 2005, 152: G875-G879.
Sunkara, M.K., et al., Bulk Synthesis of Silicon Nanowires Using a Low-Temperature Vapor-Liquid-Solid Method, Applied Physics Letters 2001, 79: 1546-1548.
Tseng, A., Recent Developments in Micromilling Using Focused Ion Beam Technology, Journal of Micromechanics and Microengineering 2004, 14: R15-R34.
Tseng, A., Recent Developments in Nanofabrication Using Ion Projection Lithography, Small 2005, 1: 594-608.
Tseng, A., Milling of Submicron Channels on Gold Layer Using Double Charged Arsenic Ion Beam, Journal of Vacuum Science & Technology B: Microelectronics and Nanostructures 2004, 22: 82-89.
Watt, F., et al., Ion Beam Lithography and Nanofabrication: A Review, International Journal of Nanoscience 2005, 4: 269-286.
Zhou, Z., et al., Two-Beam-Current Method for E-Beam Writing Gray-Scale Masks and Its Application to High-Resolution Microstructures, Applied Optics 2008, 47: 3177-3184.
Eichenfield, M., et al., Optomechanical crystals, Nature 2009, 462: 78—2.
Ekinci, KL, et al., Nanoelectromechanical systems, Review of Scientific Instruments 2005, 76: 061101-1—061101-12.
Henry, MD et al., Ga+ beam lithography for nanoscale silicon reactive ion etching, Nanotechnology 2010, 21:245303-1—245303-8.
Hoshikawa, T. et al., Relationship between Gallium Concentration and Resistivity of Gallium-Doped Czochralski Silicon Crystals: Investigation of a Conversion Curve, Japanese J. Appl. Phys. 2008, 47: 8691-8695.
Lugstein, A. et al., FIB processing of silicon in the nanoscale regime, Appl. Phys. A 2003, 76: 545-548.
Mellhaoui, X. et al., $SiO_xF_y$ passivation layer in silicon cryoetching, J. Appl. Phys. 2005, 98: 104901-1—104901-10.
Olesinski, RW et al., The Ga-Si (Gallium-Silicon) System, Bulletin of the Alloy Phase Diagrams 1985, 6: 362-364.
Sievila, P. et al., The fabrication of silicon nanostructures by focused-ion-beam implantation and TMAH wet etching, Nanotechnology 2010, 21: 145301-1—145301-6.
Tachi, S. et al., Low-temperature reactive ion etching and microwave plasma etching of silicon, Appl. Phys. Letters 1988, 52: 616-618.
Restriction Requirement from U.S. Appl. No. 13/159,335, filed on Jun. 13, 2011 in the name of Michael Shearn, mailed on Jan. 10, 2013.
Office Action from U.S. Appl. No. 13/159,335, filed on Jun. 13, 2011 in the name of Michael Shearn, mailed on Mar. 28, 2013.

* cited by examiner

METHOD FOR FABRICATING MICRO AND NANOSTRUCTURES IN A MATERIAL

CROSS REFERENCE TO RELATED APPLICATIONS

The present application claims priority to U.S. provisional application No. 61/220,982 filed on Jun. 26, 2009, incorporated herein by reference in its entirety.

STATEMENT OF GOVERNMENT GRANT

This invention was made with government support under Grant No. HR0011-04-1-0054 awarded by DARPA, Grant No. DMR-0120967 awarded by NSF, and Grant No. EEC-0812072 awarded by NSF. The U.S. Government has certain rights in the invention.

FIELD

The present application relates to a method and for fabricating micro and nanostructures in a material and in particular, a method to fabricate nanostructures in a silicon material.

BACKGROUND

A cornerstone of silicon fabrication is the ability to pattern a structure on a planar silicon surface and subsequently use this pattern as a mask to etch the structure in the silicon.

Despite the significant progress in the field, fabrication of micro and nanostructures with resist-free fabrication of precision, high aspect ratio, high fidelity, ultimate resolution and selectivity is still challenging.

SUMMARY

Provided herein are methods for fabricating micro and nanostructures and related systems that in several embodiments, allow to fabricate micro and nano structure by etching masked material with high fidelity resolution and selectivity. In particular, in several embodiments, the methods and systems herein described allow to beam lithography for micro and nanoscale silicon reactive ion etching.

According to a first aspect, in a method for fabricating structures in or on a substrate through etch masking, a method is described to determine a minimum etch mask dosage or thickness as a function of etch depth or a maximum etch depth as a function of etch mask implantation dosage or thickness. The method comprises determining a substrate etch rate ($k_{etch}$); determining a mask erosion rate ($k_{erosion}$); and determining a threshold dose ($d_{threshold}$). The method further comprises determining the minimum etch mask dosage or thickness ($d_{critical}$) or the maximum etch depth ($h_{critical}$) according to the function $$h_{critical} = \frac{k_{etch}}{k_{erosion}} * (d_{critical} - d_{threshold}).$$

According to a second aspect, a method for fabricating structures in or on a substrate is described. The method comprises patterning one or more etch masks in or on the substrate via addition or removal of a masking material according to an etch mask dosage or thickness; and etching the substrate with an etch chemistry. In the method the etching depth is a function of the etch mask dosage or thickness by establishing a maximum etching depth obtainable with said etch mask dosage or thickness, or a minimum etch dosage or thickness to obtain a desired etching depth; and the etch chemistry selectively etches the substrate with respect to the one or more etch masks.

The methods and systems herein described can be used in connection with semiconductors technology and various additional applications identifiable by a skilled person upon reading of the present disclosure, wherein fabrication of micro and nanostructure on a material is desirable.

The details of one or more embodiments of the disclosure are set forth in the accompanying drawings and the description below. Other features, objects, and advantages will be apparent from the description and drawings, and from the claims.

BRIEF DESCRIPTION OF THE DRAWINGS

The accompanying drawings, which are incorporated into and constitute a part of this specification, illustrate one or more embodiments of the present disclosure and, together with the detailed description, serve to explain the principles and implementations of the disclosure.

DETAILED DESCRIPTION

Figure 1:
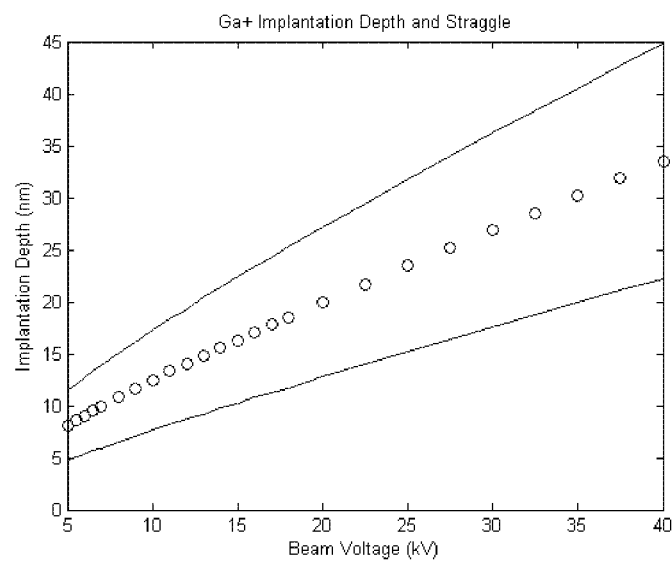
FIG. 1 shows an exemplary $Ga^+$ implantation depth for varying FIB beam voltages according to an embodiment herein described. The etch mask thickness is approximated by 2 times the straggle length.

Methods and systems are herein described to for fabricating structures in or on a substrate through etch masking that in various embodiments allow control of the etching process and the high fidelity and resolution of the fabricated structure of a micro and nano dimensions.

In an embodiment, methods and systems herein described allow determination of a minimum etch mask dosage or thickness as a function of etch depth or a maximum etch depth as a function of etch mask implantation dosage or thickness.

In an embodiment, the method comprises determining a substrate etch rate ($k_{etch}$); determining a mask erosion rate ($k_{erosion}$); determining a threshold dose ($d_{threshold}$). Determining the minimum etch mask dosage or thickness ($d_{critical}$) or the maximum etch depth ($h_{critical}$) can be performed according to the function $$h_{critical} = \frac{k_{etch}}{k_{erosion}} * (d_{critical} - d_{threshold}).$$

Determining the substrate etch rate ($k_{etch}$), for a given etch chemistry can be performed by etching a masked structure for a given period of time and measuring the resultant structure height, which can be performed with techniques and procedures identifiable by a skilled person. The ratio of the structure height to the etching time determine $k_{etch}$, which has units of [length]/[time], such as microns/minute.

Determining the threshold dose ($d_{threshold}$) can be performed by implanting a with several masks with a variety of doses and etching the implanted masks for an arbitrarily short period of time to provide etched structures using techniques and procedure identifiable by a skilled person. The threshold dose $d_{threshold}$ can be determined based on the height of the etched structure which can be detected with techniques identifiable by a skilled person. The threshold dose $d_{threshold}$ is defined as dose which fails (as defined above) for arbitrarily small etching times. Experimentally, etching for different periods of time determines an upper bound on $d_{threshold}$. As the etching time is decreased, the measured $d_{threshold}$ approaches the true value. A trend on this upper bound is thus established and the true value of can be estimated for a vanishingly small etch time as will be understood by a skilled person.

Determining the mask erosion rate ($k_{erosion}$) for a given etch chemistry can be performed in two steps. First, an area is deposited (e.g. implanted) with a given number of atoms. This number is typically expressed as an areal density or dose, having units of [atoms]/[area], but has many equivalent expressions using different metrics including number ([atoms]), linear density ([atoms]/[length]), volumetric density ([atoms]/[volume]), and thickness ([length]). Hereafter all these equivalent measures are identified as a "dose" with units of [dose]. After the area has been implanted or deposited, the sample is etched until failure of masking. Time of failure is defined as the point where the height of a structure at a given dose is less than the height of all structures that have received a higher dose. Physically, this is when the atoms remaining in the masked area are below the critical dose, which is necessary for masking capability. The ratio of the total mask dose to the time of failure determines $k_{erosion}$, which has units of [dose]/[time], such as (atoms/cm$^2$)/minute.

The ratio between $k_{etch}$ and $k_{erosion}$, for a certain etch chemistry is indicative of the orthogonality of the etch chemistry with reference to the substrate material and mask material of choice.

The wording "orthogonal" as used herein with reference to an etch chemistry in connection with a substrate material and an etch mask indicates the ability of the etch chemistry to selectively etch the substrate material over the mask material. Accordingly, the term orthogonal is related to the term "selectivity." Selectivity for a mask is the ratio of the depth of the etched material (substrate) to the depth of the masking material (e.g. photoresist or implanted gallium). In particular, in the sense of the present disclosure, a chemistry is orthogonal to an etch mask or mask material and a substrate material if the ratio of the substrate material etch rate to the mask material etch rate is greater than 1 (e.g. 2). In exemplary cases illustrated herein, this ratio is typically >>100, and can be increased and decreased by changing the etching conditions according to the experimental design of choice. While any ratio >1 is associated with masking potential, the utility of this technique generally increases with higher ratios Accordingly, in an embodiment, a method and system are described for fabricating structures in a substrate material, that are based on use of an etch mask in connection with an orthogonal etch chemistry. In an embodiment, a substrate material and etch masking material are selected so that the ratio between $K_{etch}$ and $K_{erosion}$, for a certain etch chemistry depends on the particular application and/or structure and can occur with a ratio of, for example, 1:2, 1:4, 1:5, 1:10 and lower. Parameters involved comprise the particular application, the substrate material, the mask material, the etching chemistry and a structure height which are selected according to a certain experimental design.

In an embodiment, etch masking can be performed via implantation and in particular via ion implantation. More particularly, implantation can be performed through ion beams such as Gallium (Ga), Indium (In), Gold (Au) ion beams and ion beams of additional elements identifiable by a skilled person. In an embodiment, the etching can be performed by fluorinated etch chemistry. In an embodiment, etching can be performed by a suitable dry etch chemistry orthogonal to the substrate material and the etch mask.

An exemplary etch mask that can be used in connection to various orthogonal etch chemistries is provided by Ga+ mask. One of the first observations of high selectivity Ga masking is in preferential wet etching of the silicon over Ga-doped silicon [see reference 15]. However, not only is Ga+ mask resilient against wet chemical etching, it is also effective for masking fluorinated reactive ion etching [see reference 16].

Further demonstrations of Ga-based masking in plasma etching showed that deep reactive ion etching (DRIE) with time-multiplexed etch chemistries can produce micron scale features with nanometer scale etch depths [see reference 14]. According to a further approach a cryogenic $SF_6/O_2$ silicon etch was used with an implanted Ga mask [see reference 3]. In particular, according to this further approach the mixed mode cryogenic silicon etch dramatically reduced the mechanical milling aspect, which is proportional to the bias voltage, with an increase in chemical etching thereby increasing the etch mask selectivity [see reference 4].

The Ga+ mask can be used with any substrate material which is etched in fluorine or oxygen. Exemplary substrate material that can be used with a Ga+ etch mask comprise group IV elements of the periodic table and their compounds, particularly those with C, Si, and/or Ge. Exemplary substrate material comprising group IV elements comprise silicon, silicon carbide, silica, silicon nitride, SiGe, germanium, amorphous carbon, graphite, diamond, carbon nanotubes, organic compounds, electron beam and photoresists, PDMS, and other metals such as Tungsten.

In an embodiment, the method a dry etch chemistry which relies on the high preferential etching of silicon or other material comprised in group IV over that of Gallium (Ga).

In some embodiments, the Ga+ masking techniques can be used together with Inductively Coupled Plasma Reactive Ion Etching (ICP-RIE) processes orthogonal with respect to the Ga+ mask and the substrate material of choice. In particular, the ICP-RIE can be suitably modified to retain the anisotropic patterning while preserving the Ga masking capability according to techniques identifiable by a skilled person upon reading of the present disclosure.

In some embodiments, the Ga+ masking techniques can be used together with the SF6/C4F8 and/or SF6/O2 cryogenic etch chemistry as illustrated in more details in the present disclosure.

Additional orthogonal patterning/etching chemistries comprise etch chemistries that contain different reactive anions, such as halogens (Fluoride, Chloride, Bromide, Iodide) and other anions (Hydride, Sulfide, Carbonate, Hydroxide, Nitrate, Phosphate, Sulfate, Acetate, Formate, Oxalate, and Cyanide). These etch chemistries are to be used at appropriate etching temperatures and pressures such that the resultant gallium-containing compounds are etched at a rate much lower than the resultant substrate compounds as will be understood by a skilled person. A skilled person will also be able to identify the applicable chemistry for a certain substrate material and mask material upon reading of the present disclosure.

Additional etch masks comprise any masking material able to form a compound not significantly etched by the etching chemistry of choice relative to the substrate material of choice. Elements in Group III of the periodic table, such as gallium, boron, aluminum and indium, share a similar valence structure so can form these compounds.

In an embodiment, methods and systems herein described do not require a planar surface for effective spin coating and exposure, and can be used to pattern/etch non-planar structures. Additionally the linear relationship of etch depth to dose beyond the threshold dose allow fabrication three dimensional structures in the substrate material using multi-exposure and grayscale etch masking.

A further description of the methods and systems of the present disclosure is provided with reference to applications wherein the masking, is provided by Ga+ ion implantation in connection with various etching techniques. A person skilled in the art will appreciate the applicability of the features described in detail for Ga+ silicon material for other patterning techniques and suitable material.

In some of those embodiments, silicon etch masks are patterned via $Ga^+$ ion implantation in a Focus Ion Beam (FIB). In particular, FIB implantation of Gallium (Ga) into silicon can be used to define nanoscale structures directly without resist at any stage of the fabrication, achieving both high throughput and high aspect ratio structures. Additional suitable patterning techniques comprise thermal diffusion of Ga into a material using a patterned diffusion barrier, thermal diffusion of Ga into a material using a patternable doped spin-on-glass containing gallium, direct printing of a Ga ink or eutectic, source material grown with a gallium layer already present, which than then be patterned in an arbitrary method, implantation using ion projection lithography, implantation into a deposited sacrificial layer that can be removed after etching, and additional techniques identifiable by a skilled person.

In some of those embodiments, silicon etch masks are patterned via $Ga^+$ ion implantation in FIB and then anisotropic etched in an ICP-RIE using fluorinated etch chemistries. According to some embodiments, the critical areal density of the implanted Ga layer in silicon required to achieve a desired etch depth for both a combined SF6/C4F8 etch chemistry ($SF_6/C_4F_8$) or cryogenic fluorine ($SF_6/O_2$) silicon etch is determined. Examples of high fidelity nanoscale structures down to 30 nm and high aspect ratio structures of 17:1 are shown. Since etch masks can be patterned on uneven surfaces, this lithography can be utilized to create multilayer structures in silicon. The linear selectivity versus implanted Ga density enables grayscale lithography.

In accordance with embodiments of the present disclosure, different etching regimes for pattern transfer of FIB implanted Ga+ masks in silicon are described. Due to properties of the etching plasma, there is a tradeoff between selectivity and anisotropy.

The selectivity indicates the ratio of the etch rate of material to the etch rate of the mask. As an example, if a 1-micron thickness of a masking material (such as photoresist) is removed during a process that etches a 10-microns thickness of substrate material, the selectivity is 10:1. Higher selectivity is desirable. Generally, there is a tradeoff between pattern resolution (higher for thinner masks) and maximum etch depth (higher for thicker masks). High selectivity masks enable etching of structures that have a small minimum feature size while still allowing deeply etched structures.

The wording "anisotropy" as used herein indicates the ability of an etching material to etch in a single direction vice all directions. Accordingly, an anisotropic etch is in contrast to an isotropic etch, which etches in all directions at the same rate. An example of an isotropic etch is the removal of silica by hydrofluoric acid. In particular, an anisotropic etch typically inhibits etching in other directions by using surface passivation, inhibitor deposition, crystalline anisotropic, or some combination of these or other techniques.

According to embodiments of the present disclosure, by operating at different points of the tradeoff between selectivity and anisotropy, it is possible to develop etch conditions appropriate for different applications.

For example in some embodiments, wherein minimum feature size etching is desired, a mixed-mode $SF_6/C_4F_8$ plasma can be employed that has moderate selectivity and high anisotropy and describe feature size and etch depth dependence on implantation dose. This approach is also referred to in the present description as combined SF6/C4F8 etch chemistry, an etching technique identifiable by a skilled person and described for example in [reference 8] herein incorporated by reference in its entirety.

In embodiments wherein a higher aspect ratio structures at the expense of mask notching and lower anisotropy is desired, a cryogenic $SF_6/O_2$ plasma can be used, an etching technique identifiable by a skilled person and described for example in [see reference 4] [reference 8] herein incorporated by reference in its entirety.

In embodiments, wherein maximum selectivity and complete isotropy is desired, a cryogenic $SF_6$ plasma appropriate for release of Ga implantation defined membrane.

In some embodiments, masking/etching can be extended over the undercut-limited regime of the cryogenic etch by controlling the selectivity to anisotropy tradeoff.

Although resist patterning is typically limited to planar surfaces, the Ga deposition technique of the present disclosure can be used to provide a Ga mask writing, patterns implanted on non-planar silicon structures for multilayer etching and grayscale lithography.

In an embodiment, where the methods and systems herein described are applied to nanometer scale structures, complete passivation and etch features result in low undercutting. Also in an embodiment, the high pattern fidelity of the nanoscale structures allows establishing a realistic minimum feature size figure of merit.

In accordance with an exemplary embodiment, patterning of the Ga etch mask can be performed using the dual beam Nova FIB/SEM by FEI. A cleaned silicon sample is placed at the eucentric height and rotated such that the Ga+ ion beam strikes perpendicular to the substrate surface. For a selected beam current, the $Ga^+$ beam is focused at the edge of the substrate. Automated write programs specifying the pattern and dwell times are then executed to raster the ion beam. In particular, the write programs control the blanking of the beam and the movement of the beam. In a manner analogous to a scanning electron microscope, the FIB accelerates the $Ga^+$ ions to the surface of the silicon substrate using various accelerating beam voltages according to techniques known as such to the person skilled in the art. The magnitude of the beam voltage controls both the implantation depth and the thickness of the Ga layer.

In particular, to estimate the effect of the beam voltage on the thickness of the implantation layer and implantation depth, simulations using Stopping and Range of Ions in Matter (SRIM/TRIM®) were performed for implanting $Ga^+$ ions into Silicon [see reference 22]. The results are summarized in FIG. 1, where the vertical straggle length of the implantation is taken to approximate the thickness of the Ga-implanted layer for the purpose of effective selectivity calculations. For the implantation for patterning performed in the examples of the present disclosure, Applicants used an exemplary 30 kV beam voltage. From the implantation simulations of 30 kV beams, the implantation damage is approximated to the top 15 nm of silicon, creating amorphous silicon, and the next 20 nm below as a Ga rich amorphous silicon layer, consistent with TEM measurements [see reference 10].

To investigate patterning over the entire nanometer length scale, three sets of patterns were generated. To measure the nanometer range, Applicants patterned squares starting at 500 nm and ending at 50 nm stepped in 50 nm increments. The dose columns began at $5.3*10^{15}$ cm$^{-2}$ and ended in $1.96*10^{17}$ cm$^{-2}$ with the dose stepped in approximately $1*10^{16}$ cm$^{-2}$ increments. To determine sub 200 nm resolution, Applicants again patterned squares starting at 200 nm and ending at 20 nm stepped in 20 nm increments. The third pattern arrays were circles starting at 100 nm in diameter and ending at 10 nm in diameter stepped in 10 nm increments. Both in the second and third pattern arrays, the dose column began with $1.25*10^{16}$ cm$^{-2}$ and ended in $1.25*10^{17}$ cm$^{-2}$ with the dose stepped in approximately $1.25*10^{16}$ cm$^{-2}$ increments using a measured 6.87 pA beam.

Figure 2:
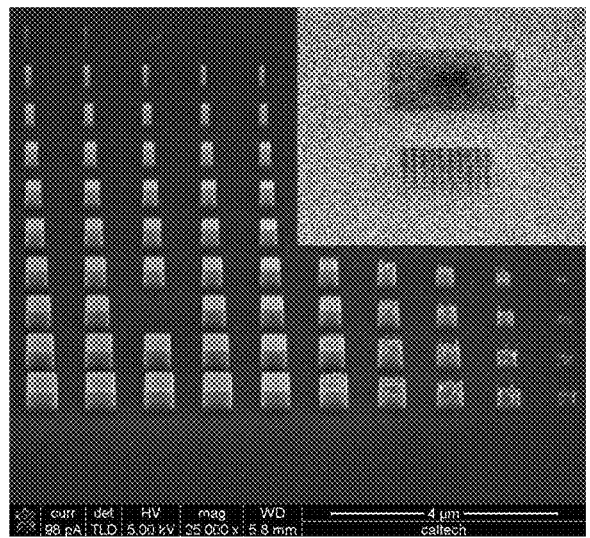
FIG. 2 shows an exemplary scanning electron micrograph (SEM) of a dose array for nanoscale $SF_6/C_4F_8$ etch according to an embodiment herein described. In the example of FIG. 2, etch depth was 460 nm with the squares ranging from 500 nm down to 50 nm in 50 nm increments. The inset of FIG. 2 is a SEM of Ga implanted nanoscale dose array in silicon. The large square was where the ion beam was focused and used as a visual marker.

For the micron scaled structures, Applicants created dose arrays of 5 micron-by-5 micron squares separated by approximately 10 microns. Each square dose was varied by incrementing the write time 2 second. With the beam current at 100 pA, this provided a dose step of $5*10^{16}$ cm$^{-2}$. The dose array began at $1*10^{16}$ cm$^{-2}$ and stopped at $5*10^{16}$ cm$^{-2}$. After implantation, verification of the patterning can be seen using a scanning electron microscope (SEM). The inset of FIG. 2 shows a SEM of the dose array for the micron scales features. In particular, the-dose array is the graphical representation used herein to show the dependence on achievable masked etch depth on the implanted areal dose In accordance with an embodiment, etching of a Ga+ mask can be performed by combined SF6/C4F8 etch chemistry. In particular, in an exemplary embodiment, patterned Ga implanted silicon samples were anisotropically etched in an Oxford Instruments PlasmaLab 100 inductively coupled plasma reactive ion etcher (ICP-RIE) 380. The Si samples, N-doped <100> rho=1-10 ohm-cm and P-doped <100> rho=0.005 ohm-cm, were placed on a 6 inch silicon carrier wafer using Fomblin oil as an adhesive and thermal conductor. The etch chemistry utilized was a mixed mode etch using SF6 as the etch gas and C4F8 as the passivation gas simultaneously injected, combined SF6/C4F8 etch chemistry silicon etch [see reference 8]. The first dose array etch was perform under the following conditions: ICP power of 1200 W, Fwd power of 10 W, table temperature of 15 C, chamber pressure of 10 mTorr, $SF_6/C_4F_8$ gas flow of 33 sccm/50 sccm, and a measured forward bias of 54 volts. The second and third dose arrays were etched under identical etching conditions as before, except Fwd power was increased to 15 W and the $C_4F_8$ gas was increased to 68 sccm; this modification improved pattern fidelity for sub 100 nm structures. Upon completion of etching, the Fomblin was removed using Isopropanol Alcohol (IPA) and the sample imaged using either the FEI Nova 600 or a FEI Sirion SEM, as shown in FIG. 2.

In particular, FIG. 2 shows a scanning electron micrograph of a dose array for nanoscale $SF_6/C_4F_8$ etch. Etch depth was 460 nm with the squares ranging from 500 nm down to 50 nm in 50 nm increments. As already mentioned above, the inset of FIG. 2 is a SEM of a Ga-implanted nanoscale dose array in silicon. The large square was where the ion beam was focused and used as a visual marker.

Dose arrays of 50 nm to 500 nm squares were etched for different times so that etch rate, minimum dose for a required depth, the critical dose, and minimum structure size could be ascertained. Samples were inspected in SEM to determine the time and height of each structure. A dose array typically allows a structure at the described etch depth for most any size and it is key to making said structures as it would be understandable by a skilled person upon reading of the present disclosure.

Figure 3:
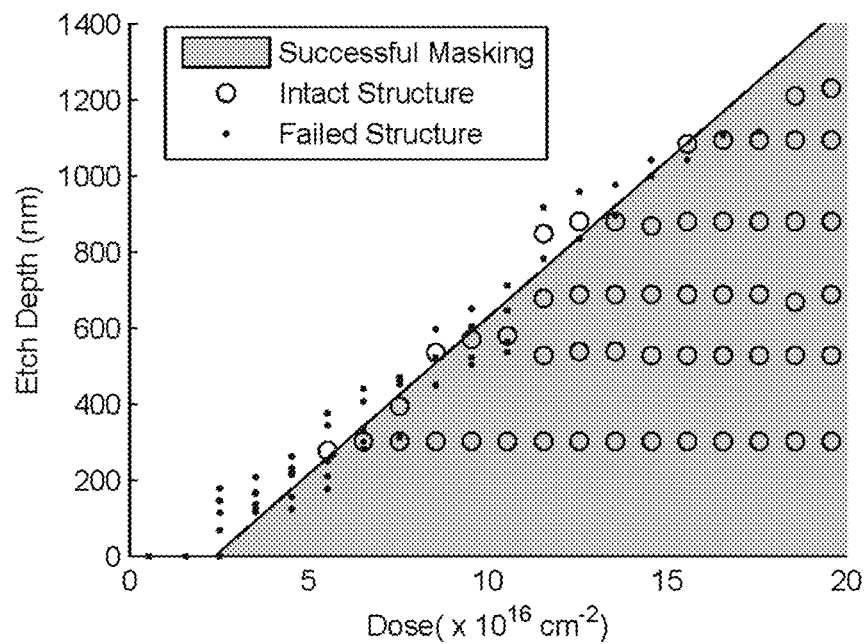
FIG. 3 shows an exemplary Ga dose array (the dose required for a given etch depth or selectivity) for the Combined SF6/C4F8 etch chemistry silicon etch according to an embodiment herein described. Each horizontal line represents a given etch time, and the diagonal describes the minimum dose required for achieving a desired etch depth.

The results of these measurements are shown in FIG. 3, which shows the Ga dose array (the dose required for a given etch depth or selectivity) for the Combined SF6/C4F8 etch chemistry silicon etch. Each horizontal line represents a given etch time, and the diagonal describes the minimum dose required for achieving a desired etch depth. Two features of this graph should be noticed. First, no measurable masking occurs below a particular dose, termed in the present disclosure as the threshold dose. Next, the height of failure displays an approximately linear relationship with the areal dose.

Motivated by this apparent structure, Applicants fitted the data with the following equation:

$$h_{critical} = \frac{k_{etch}}{k_{erosion}} * (d_{critical} - d_{threshold}) \quad (1)$$

where $h_{critical}$ is the height of the etched structure at failure, $k_{etch}$ is the experimentally measured etch rate, $d_{critical}$ is the measured dose from FIB implantation of the failed structure, and $k_{erosion}$ and $d_{threshold}$ are the effective erosion rate of the mask and the threshold dose treated as free parameters to be determined by a least squares fit to the data. The etch rate, $k_{etch}$ was determined to be 186 nm/min for the P-doped silicon samples. For the Combined SF6/C4F8 etch chemistry data, the fit yields the following fit parameters:

$$h_{critical} = \frac{0.186 \left[\frac{\mu m}{min}\right]}{2.45 * 10^{16} \left[\frac{ions * cm^{-2}}{min}\right]} * (d_{critical} - 1.85 * 10^{16} [ions * cm^{-2}]) \quad (2)$$

Figure 4:
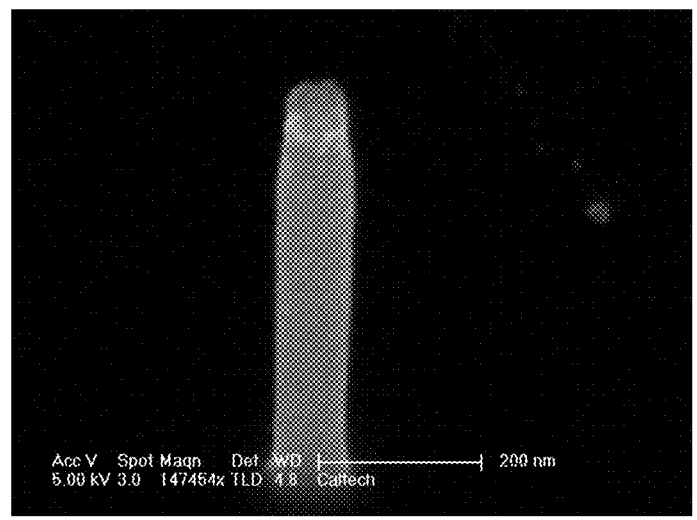
FIG. 4 shows an exemplary SEM of a silicon nanopillar, 72 nm in diameter and 800 nm tall according to an embodiment herein described.

Since the implantation thickness was approximated as 20 nm, the selectivity of mask improves as the areal dose increases (increasing the density of the Ga mask) and is also described using equation (1) by dividing the etch height by the mask thickness of 20 nm. Although the etch damage is approximated to be the 15 nanometers of amorphous silicon on the top of the etch mask, Applicants note that surface remains notably smooth. The first dose array demonstrates that the masking technique in accordance with the present disclosure can create, at the minimum write pattern of 50 nm, a 72 nm diameter nanopillars and 800 nm tall with sidewall and roughness of less than 5 nm, as shown in FIG. 4. Although the patterned size was originally 50 nm, the increase in size to 72 nm is consistent to SEM resolution and SRIM calculations of having a lateral straggle length of 7.2 nm. Other contributions to the mask size increase can be attributed to several factors including approximation of the beam as Gaussian and the ion beam being slightly defocused. Applicants approximate the lateral straggle as being the most significant of all the contributions at this beam voltage. Resolution and characterization of the Ga beam width will be discussed later in the present application [see references 1, 7, 12, 20].

To investigate the minimum structure size, Applicants employed the second and third dose array for the nanoscale SF$_6$/C$_4$F$_8$ etch.

Figure 5:
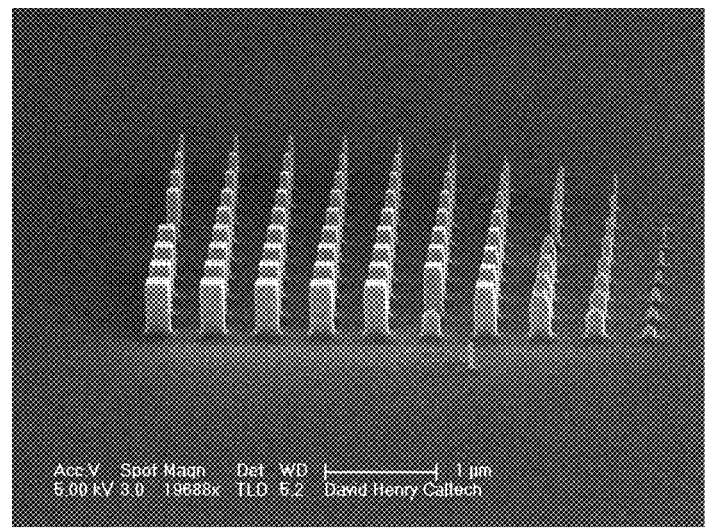
FIG. 5 shows an exemplary SEM of a second dose array for nanoscale $SF_6/C_4F_8$ etch according to an embodiment herein described. In the example of FIG. 5, etch depth was 448 nm with the squares ranging from 200 nm down to 20 nm in 20 nm increments.

In accordance with an embodiment of the disclosure, the second dose array consisted of squares etched 448 nm tall, shown in FIG. 5. The minimum pattern etched was a 43 nm square with an aspect ratio of 10:1. Although a 20 nm square was implanted, the SEM shows only a mound where the pattern began to etch but ultimately failed, possibly due to a lower Ga$^+$ concentration cause by imperfect focusing. It is also clear that the minimum dose of $1.25*10^{16}$ cm$^{-2}$ was not sufficient to protect the silicon much greater than 70 nm.

Figure 6:
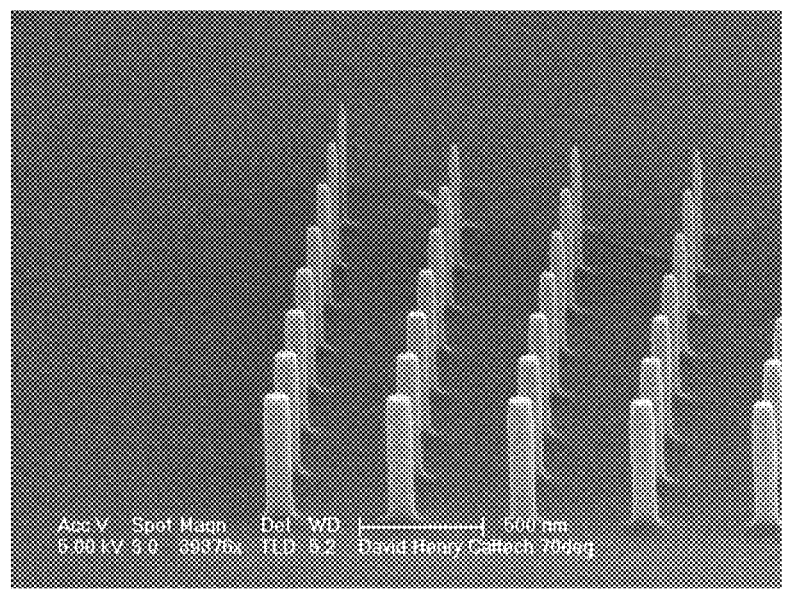
FIG. 6 shows a SEM of a third dose array for nanoscale $SF_6/C_4F_8$ etch. In the example of FIG. 6, etch depth was 448 nm with the pillars ranging from 100 nm down to 10 nm diameters in 10 nm increments.

The third dose array patterns were circles for vertical silicon nanowire fabrication and were etched simultaneously with the second dose array pattern. The minimum pattern etched was the 31 nm diameter pillar, as shown in FIG. 6. The etch was reentrant at 89.15 degrees causing the base of the pillar to be at an 18 nm diameter. Although it is clear that some masking occurred for the 20 nm pattern, the reentrant angle did not permit the structure to withstand the etch. Important to note is the higher fidelity of this patterning as compared to previous demonstrations.

This etch attained a very high selectivity with no oxygen in the etch chemistry. This is contrary to the masking mechanism of GaO$_x$ forming at the surface proposed elsewhere [see reference 16]. Formation of a GaO$_x$ layer during sample exposure to ambient is also excluded due to the 28 nm implantation depth. This leads us to hypothesize another masking mechanism. Fluorine can bond with the Ga to create an involatile GaF$_x$ mask, which can also contribute to further physical sputtering resistance. This is consistent with previous results using reactive ion etching with SF$_6$ which relies on F$_+$ ions for etching [see references 3, 14, 16].

In an embodiment, etching of silicon masked with Ga+ can be performed by cryogenic silicon etching. In particular, using the same etching system and mounting techniques as the nanoscale etch, micron sized features were also etched to determine the etch rate and threshold dose for a required depth. The etch chemistry employed for this scale was a mixed mode cryogenic silicon etch. This etch uses SF$_6$ as the etchant gas but relies on O$_2$ to create a sidewall passivation layer of SiO$_x$F$_y$. This molecule is formed when the substrate temperature is below –85 C. Details of the sidewall passivation and etch process is detailed elsewhere and is not discussed here [see references 4, 9]. The etch conditions used are as follows: ICP power of 900 W, Fwd power of 10 W, table temperature of –130 C, chamber pressure of 10 mTorr, SF$_6$/C$_4$F$_8$ gas flow of 70/6.5 sccm, and a forward bias of 54 volts.

Figure 7:
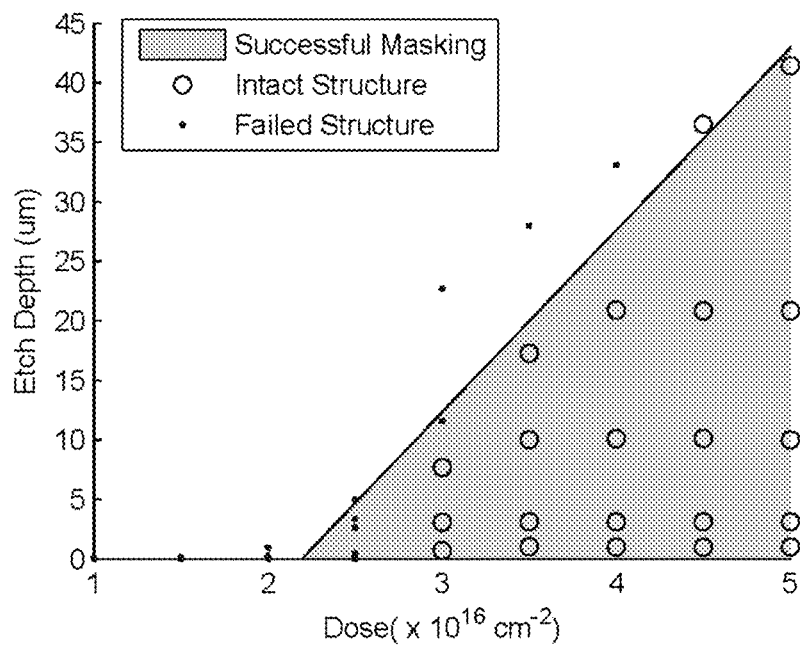
FIG. 7 shows an exemplary Ga dose array (the dose required for a given depth or selectivity) for the Cryogenic silicon etch according to an embodiment herein described. Each horizontal line represents a given etch time, and the diagonal describes the minimum dose required for achieving a desired etch depth.

Threshold dose and selectivity for the dose array illustrated in FIG. 3 were determined. In particular, the cryogenic dose array described above in connection with FIG. 3, was etched for etch times of 1, 3, 10, 20 and 40 minutes with a measured etch rate, $k_{etch}$, of 1.03 microns per minute; the results are detailed in FIG. 7. Each horizontal line represents a given etch time, and the diagonal describes the minimum dose required for achieving a desired etch depth. The etch depth dependence on dose for the cryogenic etch was least squares fit and is described by equation (2).

The Fwd power, and subsequently the bias voltage, was intentionally set to match that of the combined SF6/C4F8 etch chemistry etch with the other etching parameters set to optimize the etch. Although the ICP and gas chemistry changes the plasma density, matching the bias voltages allows for the milling aspect of the two etch chemistries to be more closely compared.

$$h_{critical} = \frac{1.03 \left[\frac{\mu m}{min}\right]}{0.06736 * 10^{16} \left[\frac{ions * cm^{-2}}{min}\right]} * (d_{critical} - 2.2 * 10^{16} [ions * cm^{-2}]) \quad (3)$$

Interestingly, $t_{hreshold}$ is nearly the same for both etch chemistries ($2.2*10^{16}$ ions*cm$^{-2}$ as compared to $1.85*10^{16}$ ions*cm$^{-2}$), while $k_{erosion}$ for the cryogenic etch is nearly two orders of magnitude lower than for combined SF6/C4F8 etch chemistry. This threshold dose, etched with 10 W of Fwd power, is consistent to that reported by Chekurov et al. whom etched with 2-3 W of Fwd power and with an etch rate approximately double of that reported here [see reference 3]. To compare the fidelity of the combined SF6/C4F8 etch chemistry etch to that of the cryogenic, a smaller feature size combined SF6/C4F8 etch chemistry dose array pattern was cryogenically etched for 1 minute (approximately 1 micron).

Figure 8:
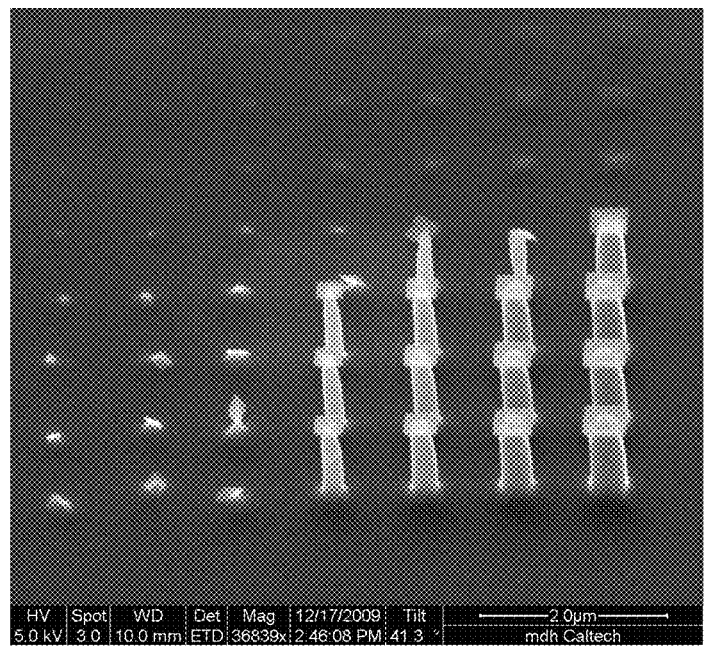
FIG. 8 shows an exemplary SEM of Ga-masked silicon squares, cryogenically etched 1 micron tall, to quantify the mask undercut associated with cryogenic etching according to an embodiment herein described. In the example of FIG. 8, the pattern etched is substantially identical to that used for the combined SF6/C4F8 etch chemistry dose array of FIG. 2 taking into account defocusing and other processes that were modeled as in FIG. 1.

The minimum resolvable feature was a 350 nm square mask with the pillar body 200 nm at its widest spot, as shown in FIG. 8.

Figure 9:
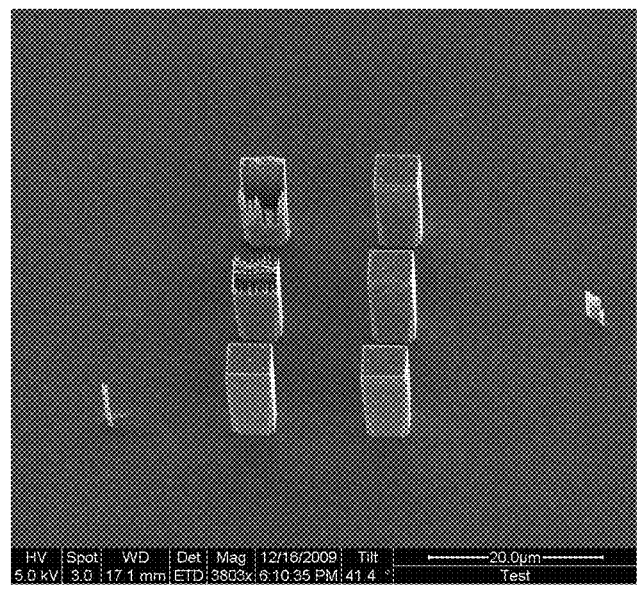
FIG. 9 shows an exemplary SEM of a dose array for the cryogenic etch according to an embodiment herein described. In the example of FIG. 9, etch depth was 10.1 μm with 5 μm squares. The dose was varied in this array from $1\times10^{16}$ cm$^{-2}$ to $5\times10^{16}$ cm$^{-2}$ in $0.5\times10^{16}$ cm$^{-2}$ increments.

In particular, FIG. 8 shows a SEM of Ga-masked silicon squares, cryogenically etched 1 micron tall, to quantify the mask undercut associated with cryogenic etching. The pattern etched is identical to that used for the combined SF6/C4F8 etch chemistry dose array taking into account slight experimental variations. In particular, the dimensions are slightly different that those defined in the patterning file, due to defocusing and other processes modeled as in FIG. 1. In particular the same conditions for defining the mask in FIGS. 2 and 8, were used but the etches were different, which is what causes the difference in outcomes. Thus, taking those into account, the pattern is exactly as predicted with (importantly) little to no undercut FIG. 9 shows a SEM of a dose array the cryogenic etch. Etch depth was 10.1 μm with 5 μm squares. The dose was varied in this array from $1\times10^{16}$ cm$^{-2}$ to $5\times10^{16}$ cm$^{-2}$ in $0.5\times10^{16}$ cm$^{-2}$ increments.

Sensitivity of Threshold Dose to Ion Implantation Depth were then determined. In particular, to investigate if the FIB beam accelerating voltage affected the threshold dose, a 6 by 4 array of Ga implanted 5 μm by 10 μm rectangles was patterned. The beam voltages sampled were 5, 10, 20, and 30 kV written with beam currents of 120 pA, 50 pA, 81 pA, and 100 pA respectively. Beam currents were selected to match implantation rates to as close as allowed by the FIB's settings. Each dose array started approximately at $0.375\times10^{16}$ cm$^{-2}$ with the next higher dose value doubling that of the previous up to approximately $13\times10^{16}$ cm$^{-2}$. Two samples were then etched to etch heights of 10.2 μm and 20.1 μm under the same conditions as before but with a reduced Fwd power of 3 W.

Reduction of the Fwd power increased the slope of the dose array, maximizing etch mask selectivity, to amplify any etch height changes due to beam voltage. A failure of the etch mask during cryogenic etching rapidly destroys the structure, so for this experiment a loss of etch mask denoted a failure. For the 10.2 μm etch, the 5, 10, 20 and 30 kV structures required a minimum dose of $2.1\times10^{16}$ cm$^{-2}$, $1.6\times10^{16}$ cm$^{-2}$, $16\times10^{16}$ cm$^{-2}$ and $0.75\times10^{16}$ cm$^{-2}$ respectively. For the 20.1 μm etch, the 5, 10, 20 and 30 kV structures required a minimum dose of $2.1\times10^{16}$ cm$^{-2}$, $1.6\times10^{16}$ cm$^{-2}$, $0.8\times10^{16}$ cm$^{-2}$ and $1.6\times10^{16}$ cm$^{-2}$ respectively. There is a possible trend of slightly improved masking ability for higher beam voltages.

Different accelerating voltages do result in different ion straggles and thus different effective Ga layer thicknesses, an etch mask thickness increase due to beam voltage increase. Although this experiment requires more data for clarification of how the masking mechanism depends on the implantation voltage, from this we concluded that if beam voltage did affect the critical dose, it would be by an acceptable value of less than $1.35\times10^{16}$ cm$^{-2}$ for 5-30 kV beam voltage shifts with a previously determined threshold dose of $2.2\times10^{16}$ cm$^2$.

In an embodiment, Ga+ mask on silicon allows to pattern/etch non-planar structures and in particular allows fabrication three dimensional structures in the substrate material using multiexposure and grayscale etch masking.

In particular, in an embodiment, multiple implantations for Ga+ etch masking can be performed regardless of sample surface topography. Experimentally, this fabrication procedure proceeds as follows: implant initial mask, etch the silicon, implant second mask, and etch the silicon. This repeating sequence can continue for as long at the Ga etch mask remains. Re-implantation of previous structures can also extend the critical height for these structures.

Figure 10:
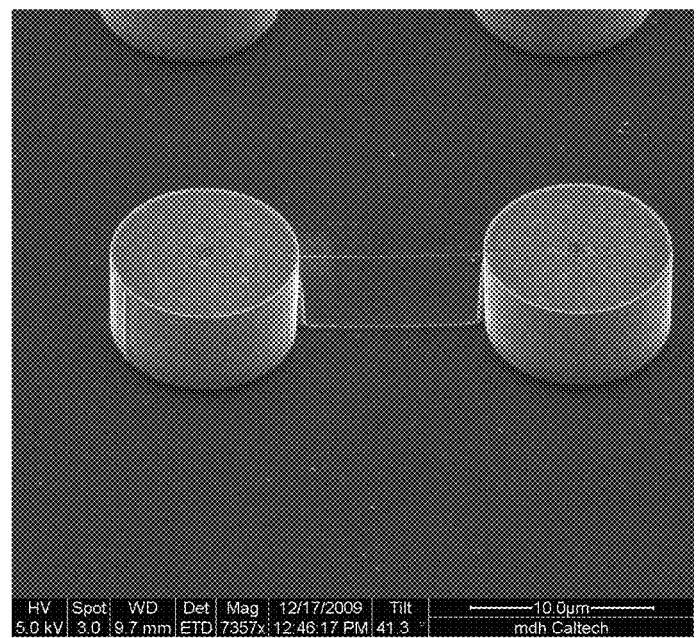
FIG. 10 shows an exemplary SEM of 10 micron diameter silicon pillars, etched 5 microns tall, with an 80 by 20 nm silicon nanowire suspended in between according to an embodiment herein described. In the example of FIG. 10, the wire is connected 500 nm below the tops of the pillars. The thickness of the wire is consistent with the width of the Ga implanted layer.

Applicants demonstrated this technique using both the combined SF6/C4F8 etch chemistry and the cryogenic etch to create a suspended silicon nanowire connected to two pads, as shown in FIG. 10. First, two 10 micron diameter circles separated by 10 microns were Ga implanted at a dose of $2*10^{17}$ cm$^{-2}$. The structure was then etched to a height of 0.5 microns using the combined SF6/C4F8 etch chemistry etch. A Ga mask was then implanted in the shape of a rectangle connecting the two pillars with the same dose as the circles. A mask undercutting cryogenic etch was then performed for an etch height of 5 microns; this step utilized the undercut to remove all unmasked silicon below the rectangle. The resulting structure was an 80 nm by 20 nm silicon nanowire suspended between two 10 μm diameter pillars etched 5 μm tall with the nanowire connected half a micron below the pillar tops, see FIG. 10. This technique utilized the advantages of each etch, the high pattern fidelity of the combined SF6/C4F8 etch chemistry etch and the inherent undercutting and high selectivity of the cryogenic etch. In particular, the 500 nm dimension is controlled by the composition of etching and mask-masking steps; the 80 nm by 20 nm dimension are primarily due to the conditions of the mask-making step (as described by FIG. 1 and elsewhere) This is an example of the additive nature of the process where a composition of different masks and etches can be used.

Figure 11:
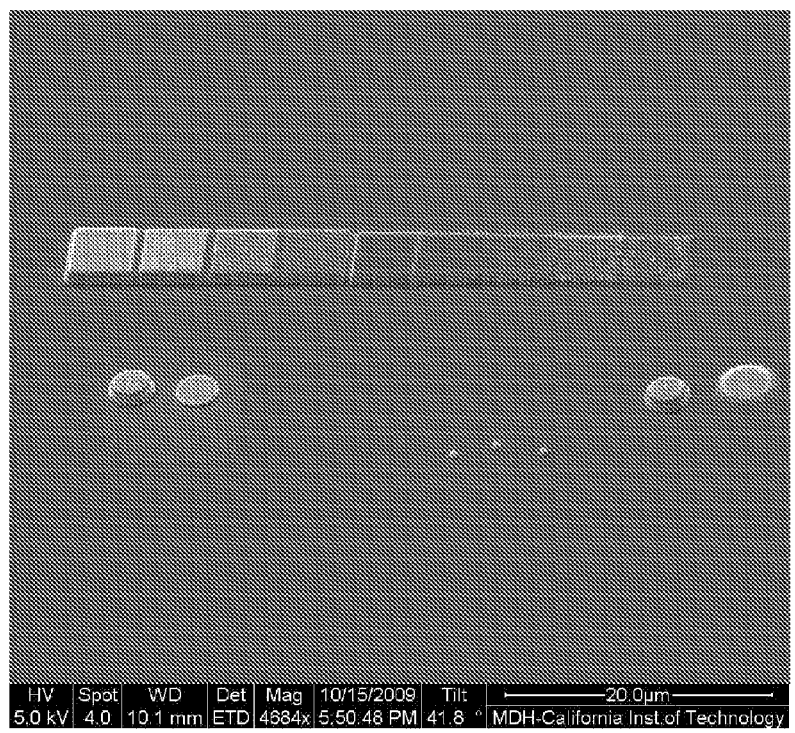
FIG. 11 shows an exemplary SEM of 5 μm squares with varied doses according to an embodiment herein described. When the etch depth increases over the critical dose depth, the structure begins to etch but maintains its relative height to its neighbor.

In an embodiment, methods and systems herein described allow creation of graded structures based on the etch depth's linear dependence on the critical dose. In those embodiments, the structures are dosed to different critical doses and etched to the desired height. At the heights corresponding to their critical dose the structures will then start to etch at the same rate as the substrate, in a manner similar in principle to grayscale lithography [see references 13, 21]. These implanted structures can then be etched to create sloped features such as blazed gratings and optical lenses. This approach was demonstrated using nine 5 micron squares arranged in a row. Each square's dose was increased approximately $2.5*10^{16}$ cm$^{-2}$ more than it neighbor square for a dose ranging from $2.5$-$22.5*10^{16}$ cm$^{-2}$ and etched using the combined SF6/C4F8 etch chemistry etch. This treatment created a stair step set of platforms as shown in FIG. 11. In particular, FIG. 11 shows a SEM of 5 μm squares with varied doses. When the etch depth increases over the critical dose depth, the structure begins to etch but maintains its relative height to its neighbor.

The theoretical limit to the highest resolution structures is highly dependent on the beam spot size and the accelerating beam voltage. These two parameters define the effective implantation masking area, as the spot size establishes the kernel to be convolved with the desired dose profile and the accelerating voltage determines the further spread of ions after interacting with the silicon. For the system according to the present disclosure, a theoretical resolution limit can be estimated by summing these dimensions in quadrature [see reference 7]:

$$d_{system}^2 = d_{spot}^2 + d_{ion}^2 \qquad (4)$$

For the minimum spot size $d_{spot}$=5 nm and lateral ion spread at 5 kV $d_{ion}$=3.2 nm+1.8 nm (1 sigma straggle), resulting is $d_{system}$=7.07 nm. For the experiments at 30 kV, $d_{ion}$=9.9+5.6 nm, resulting in $d_{system}$=16.2 nm, as compared to our minimum realized structure of 43 nm. This analysis does not take into account any excess resolution loss from deflection error, exposure scheme (amount of overlap between shots was 50%), defocus, or other experimental parameters which can account for the measured minimum [see references 18, 19].

To achieve the greatest etch depths, and hence highest selectivity, it is desired to maximize the amount of Ga present in the top layer. However, further exposure of the beam past a certain dwell time leads to a steady state where the influx of Ga$^+$ is balanced by the sputtered Ga.

Figure 12:
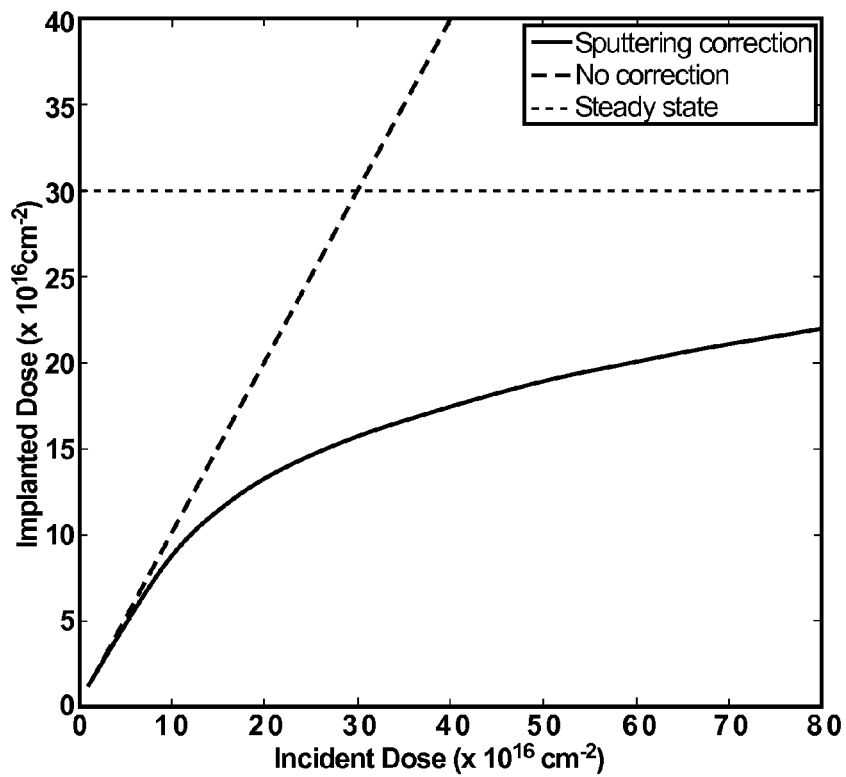
FIG. 12 shows a plot of implanted dose as a function of incident dose. In the example of FIG. 10 the limiting value is $3*10^{17}$ Ga atoms/cm$^2$.

FIG. 12 shows the amount of Ga present in the silicon sample, areal dose, as a function of total ion flux for a 30 kV beam. This is approximated by from the total flux of Ga atoms minus the sputtered Ga atoms, using the composition-dependent sputter yield computed by Monte Carlo simulation [see reference 5].

As expected, for low doses the areal dose implanted is linear with total flux, as the sputtered material has a relatively low concentration of Ga relative to the amount implanted. However, as the sputtered depth approaches the mean implantation depth of 27 nm, the total concentration of Ga in the sputtered material increases. By 28.4 nm the areal concentration is of $10^{17}$ Ga atoms/cm$^2$, which is lower than total incident flux by 16%. The Ga sputter yield rapidly increases from this point, requiring an enormous amount of incident flux to increase the implanted concentration. As an example, doubling the concentration from $10^{17}$ to $2*10^{17}$ Ga atoms/cm$^2$ requires more than five times the incident flux leading to a mask 144 nm below the surrounding substrate. The maximum implanted value at steady state, calculated to be $3*10^{17}$ Ga atoms/cm$^2$, is dependent on the ratio of the mean implantation depth and the sputter yield. For the two etch chemistries discussed above, this leads to a theoretical maximum etch depth of 3406 nm for the combined SF6/C4F8 etch chemistry and 425 µm for the cryogenic etch chemistry and a maximum effective selectivity of 85 and 10625 respectively assuming a 40 nm mask layer. However, practically achievable figures will be lower, as determined by fidelity requirement and the point of diminishing returns in implantation, where the selectivity increase is less than the amount milled by the Ga beam.

Based on SRIM simulations, the 1-sigma average density of Ga assuming no phase segregation or preferential removal of silicon is approximately 14% of the density of a pure Ga layer. However, silicon's low solubility in Ga is well known [see reference 17], so the assumption of complete segregation of the implanted Ga combined with measured Ga lattice constants leads to a figure of 5.11-8.66 equivalent monolayers of Ga present at the threshold dose [see reference 2]. These data supports the conclusion that the etch masking mechanism can possibly be provided by the formation of a contiguous Ga layer that forms involatile compounds in fluorine-based chemistries and fails once the layer is breached via physical sputtering of the mask. The etch mechanism indicated herein is not intended to be limiting and is herein provided only for guidance purposes.

The description set forth above is provided to give those of ordinary skill in the art a complete disclosure and description of how to make and use the embodiments of the methods and systems of the disclosure and related devices and components, and are not intended to limit the scope of the disclosure. Although any methods and materials similar or equivalent to those described herein can be used in the practice for testing of the assembly, components, device(s) and methods herein disclosed, specific examples of appropriate materials and methods are described herein.

Modifications of the above-described modes for carrying out the methods and systems herein disclosed that are obvious to persons of skill in the art are intended to be within the scope of the following claims. All patents and publications mentioned in the specification are indicative of the levels of skill of those skilled in the art to which the disclosure pertains. All references cited in this disclosure are incorporated by reference to the same extent as if each reference had been incorporated by reference in its entirety individually.

It is also to be understood that the terminology used herein is for the purpose of describing particular embodiments only, and is not intended to be limiting. As used in this specification and the appended claims, the singular forms "a," "an," and "the" include plural referents unless the content clearly dictates otherwise. The terms "multiple" and "plurality" includes two or more referents unless the content clearly dictates otherwise. Unless defined otherwise, all technical and scientific terms used herein have the same meaning as commonly understood by one of ordinary skill in the art to which the disclosure pertains.

A number of embodiments of the device(s) and methods herein disclosed have been described. Nevertheless, it will be understood that various modifications may be made without departing from the spirit and scope of the disclosure. Accordingly, other embodiments are within the scope of the following claims.

REFERENCES

[1] Ampere A T (2005) Recent Developments in Nanofabrication Using Ion Projection Lithography Small 1 594-608

[2] Barrett C S and Spooner F J (1965) Lattice Constants of Gallium at 297[deg] K Nature 207 1382-

[3] Chekurov N, Grigoras K, Peltonen A, Franssila S and Tittonen I (2009) The fabrication of silicon nanostructures by local gallium implantation and cryogenic deep reactive ion etching Nanotechnology 20 065307

[4] de Boer M J, Gardeniers J G E, Jansen H V, Smulders E, Gilde M J, Roelofs G, Sasserath J N and Elwenspoek M (2002) Guidelines for etching silicon MEMS structures using fluorine high-density plasmas at cryogenic temperatures Microelectromechanical Systems, Journal of 11 385-401

[5] Frey L, Lehrer C and Ryssel H (2003) Nanoscale effects in focused ion beam processing Applied Physics A: Materials Science & Processing 76 1017-23

[6] Gates B D, Xu Q, Stewart M, Ryan D, Willson C G and Whitesides G M (2005) New approaches to nanofabrication: molding, printing, and other techniques Chem Rev 105 1171-96

[7] Gierak J, Mailly D, Hawkes P, Jede R, Bruchhaus L, Bardotti L, Prével B, Mélinon P, Perez A, Hyndman R, Jamet J P, Ferré J, Mougin A, Chappert C, Mathet V, Warin P and Chapman J (2005) Exploration of the ultimate patterning potential achievable with high resolution focused ion beams Applied Physics A: Materials Science & Processing 80 187-94

[8] Henry M D, Walavalkar S, Homyk A and Scherer A (2009) Alumina etch masks for fabrication of high-aspect-ratio silicon micropillars and nanopillars Nanotechnology 255305

[9] Jansen H V, Boer M J d, Unnikrishnan S, Louwerse M C and Elwenspoek M C (2009) Black silicon method X: a review on high speed and selective plasma etching of silicon with profile control: an in-depth comparison between Bosch and cryostat DRIE processes as a roadmap to next generation equipment Journal of Micromechanics and Microengineering 19 033001

[10] Kato N I, Kohno Y and Saka H (1999) Side-wall damage in a transmission electron microscopy specimen of crystalline Si prepared by focused ion beam etching. AVS) pp 1201-4

[11] Marrian C R K and Tennant D M (2003) Nanofabrication Journal of Vacuum Science & Technology A: Vacuum, Surfaces, and Films 21 S207-S15
[12] Melngailis J, Mondelli A A, Berry Iii I L and Mohondro R (1998) A review of ion projection lithography Journal of Vacuum Science & Technology B: Microelectronics and Nanometer Structures 16 927-57
[13] Mosher L, Waits C M, Morgan B and Ghodssi R (2009) Double-Exposure Grayscale Photolithography Microelectromechanical Systems, Journal of 18 308-15
[14] Qian H X, Wei Z, Jianmin M, Lennie E N L and Zeng X R (2008) Fabrication of Si microstructures using focused ion beam implantation and reactive ion etching Journal of Micromechanics and Microengineering 035003
[15] Schmidt B, Bischoff L and Teichert J (1997) Writing FIB implantation and subsequent anisotropic wet chemical etching for fabrication of 3D structures in silicon Sensors and Actuators A: Physical 61 369-73
[16] Schmidt B, Oswald S and Bischoff L (2005) Etch Rate Retardation of Ga[sup +]-Ion Beam-Irradiated Silicon Journal of The Electrochemical Society 152 G875-G9
[17] Sunkara M K, Sharma S, Miranda R, Lian G and Dickey E C (2001) Bulk synthesis of silicon nanowires using a low-temperature vapor-liquid-solid method Applied Physics Letters 79 1546-8
[18] Tseng A A (2004) Recent developments in micromilling using focused ion beam technology Journal of Micromechanics and Microengineering 14 R15-R34
[19] Tseng A A, Insua I A, Park J S, Li B and Vakanas G P (2004) Milling of submicron channels on gold layer using double charged arsenic ion beam Journal of Vacuum Science & Technology B: Microelectronics and Nanometer Structures 22 82-9
[20] Watt (2005) Ion Beam Lithography and Nanofabrication: A Review International journal of nanoscience 4 269
[21] Zhou Z and Lee S H (2008) Two-beam-current method for e-beam writing gray-scale masks and its application to high-resolution microstructures Appl. Opt. 47 3177-84
[22] Ziegler J F, Biersack J P and Littmark U (1985) The stopping and range of ions in solids (New York: Pergamon)

The invention claimed is:
1. In a method for fabricating structures in or on a substrate through etch masking via addition or removal of a masking material and subsequent etching, a method to determine i) minimum etch mask dosage or thickness as a function of etch depth or ii) maximum etch depth as a function of etch mask implantation dosage or thickness, comprising:
determining a substrate etch rate ($k_{etch}$);
determining a mask erosion rate ($k_{erosion}$);
determining a threshold dose ($d_{threshold}$); and
determining a minimum etch mask thickness or dosage ($d_{critical}$) or the maximum etch depth ($h_{critical}$) according to the function

$$h_{critical} = \frac{k_{etch}}{k_{erosion}} * (d_{critical} - d_{threshold}).$$

2. The method of claim 1, wherein etch masking occurs via implantation.
3. The method of claim 2, wherein the implantation is ion implantation.
4. The method of claim 1, wherein the etching occurs by way of a fluorinated etch chemistry.
5. The method of claim 1, wherein the substrate is a substrate made of a group IV element or a compound of a group IV element.
6. The method of claim 5, wherein the substrate is a silicon substrate or a carbon substrate.
7. The method of claim 5, wherein the substrate is a silicon dioxide, graphite or diamond substrate.
8. The method of claim 5, wherein the substrate is a silicon or silicon dioxide substrate and the etch chemistry is a fluorinated etch chemistry.
9. The method of claim 1, wherein the addition of masking material is via Ga+ ion implantation.
10. The method of claim 9, wherein the Ga+ ion implantation is a focused ion Ga+ ion beam implantation.
11. The method of claim 1, wherein the addition of masking material is via a focused ion beam implantation.
12. The method of claim 4, wherein the fluorinated etch chemistry is a combined $SF_6/C_4F_8$ etch chemistry in case of a first structure and a cryogenic fluorine ($SF_6/O_2$) etch chemistry in case of a second structure.
13. The method of claim 12, wherein the first structure is a nanoscale structure and the second structure is a microscale structure.
14. The method of claim 1, wherein the substrate comprises one or more non-planar surfaces and the patterning occurs on said one or more non-planar surfaces.
15. The method of claim 14, wherein the addition of masking material is via non-orthogonal ion implantation.
16. The method of claim 15, wherein the non-orthogonal ion implantation occurs through inclination of the substrate with respect to an ion implantation source.
17. The method of claim 1, wherein the substrate is silicon and the implantation is Ga+ ion implantation.
18. The method of claim 1, wherein the addition of masking material is via ion implantation, said ion implantation forming implantation layers acting as etch masks.
19. The method of claim 1, wherein the structures are nanoscale structures.
20. The method of claim 1, further comprising selecting a structure size upon selection of an etching depth.
21. The method of claim 1, wherein determining the substrate etch rate comprises measuring height of a material of the substrate after a certain amount of time during which etching is performed, and calculating a ratio between the height and the amount of time.
22. The method of claim 1, wherein determining the mask erosion rate comprises:
implanting or depositing a set masking dose in/on a sample area;
etching the sample area until failure of masking, thus determining a time of failure; and
calculating a ratio between the masking dose and the time of failure.
23. The method of claim 1, wherein determining the threshold dose comprises:
implanting or depositing a plurality of doses in/on a sample area;
etching the sample area for an arbitrarily small amount of time; and
determining a dose for which failure of masking occurs for said arbitrarily small amount of time.

* * * * *